US012575406B2

(12) United States Patent
Huang et al.

(10) Patent No.:  US 12,575,406 B2
(45) **Date of Patent:      \*Mar. 10, 2026**

(54) PASSIVATION STRUCTURE WITH INCREASED THICKNESS FOR METAL PADS

(71) Applicant: Taiwan Semiconductor Manufacturing Co., Ltd., Hsinchu (TW)

(72) Inventors: Hung-Shu Huang, Taichung City (TW); Ming-Chyi Liu, Hsinchu (TW)

(73) Assignee: Taiwan Semiconductor Manufacturing Co., Ltd., Hsinchu (TW)

( \* ) Notice: Subject to any disclaimer, the term of this patent is extended or adjusted under 35 U.S.C. 154(b) by 0 days.

This patent is subject to a terminal disclaimer.

(21) Appl. No.: 18/766,279

(22) Filed: Jul. 8, 2024

(65) Prior Publication Data

US 2024/0363563 A1      Oct. 31, 2024

Related U.S. Application Data

(60) Continuation of application No. 17/818,736, filed on Aug. 10, 2022, now Pat. No. 12,057,418, which is a
(Continued)

(51) Int. Cl.
*H01L 23/00*          (2006.01)
*H01L 23/31*          (2006.01)
(Continued)

(52) U.S. Cl.
CPC .......... *H01L 24/05* (2013.01); *H01L 23/3171* (2013.01); *H01L 23/4952* (2013.01);
(Continued)

(58) Field of Classification Search
CPC . H01L 24/05; H01L 23/3171; H01L 23/4952; H01L 23/49866; H01L 23/53295;
(Continued)

(56) References Cited

U.S. PATENT DOCUMENTS 9,059,263 B2    6/2015  Ramachandran et al.
11,532,579 B2   12/2022  Huang et al.
(Continued)

FOREIGN PATENT DOCUMENTS

CN      101252096 A     8/2008
KR      20140093980 A   7/2014
WO      2011021244 A1   2/2011

*Primary Examiner* — Thanh T Nguyen
(74) *Attorney, Agent, or Firm* — Slater Matsil, LLP

(57)          ABSTRACT

A method includes depositing a first dielectric layer covering an electrical connector, depositing a second dielectric layer over the first dielectric layer, and performing a first etching process to etch-through the second dielectric layer and the first dielectric layer. An opening is formed in the first dielectric layer and the second dielectric layer to reveal the electrical connector. A second etching process is performed to laterally etch the first dielectric layer and the second dielectric layer. An isolation layer is deposited to extend into the opening. The isolation layer has a vertical portion and a first horizontal portion in the opening, and a second horizontal portion overlapping the second dielectric layer. An anisotropic etching process is performed on the isolation layer, with the vertical portion of the isolation layer being left in the opening.

20 Claims, 13 Drawing Sheets

Related U.S. Application Data division of application No. 17/100,010, filed on Nov. 20, 2020, now Pat. No. 11,532,579.

(60) Provisional application No. 63/051,011, filed on Jul. 13, 2020.

(51) Int. Cl.
  *H01L 23/495* (2006.01)
  *H01L 23/498* (2006.01)
  *H01L 23/532* (2006.01)

(52) U.S. Cl.
  CPC .. *H01L 23/49866* (2013.01); *H01L 23/53295* (2013.01); *H01L 24/03* (2013.01); *H01L 2224/04042* (2013.01); *H01L 2224/0558* (2013.01); *H01L 2224/05686* (2013.01)

(58) Field of Classification Search
  CPC ........... H01L 24/03; H01L 2224/04042; H01L 2224/0558; H01L 2224/05686; H01L 24/13; H01L 24/48; H01L 2224/02166; H01L 2224/13; H01L 2224/48; H01L 2224/48453; H01L 2924/00014; H01L 21/76831; H01L 21/76816; H01L 21/4803; H01L 23/488; H01L 23/28; H01L 21/02164; H01L 21/02214; H01L 21/02274; H01L 21/31116; H01L 24/02
  See application file for complete search history.

(56) References Cited

U.S. PATENT DOCUMENTS

| | | | | |
|---|---|---|---|---|
| 12,057,418 | B2 * | 8/2024 | Huang | .............. H01L 23/49866 |
| 2002/0022361 | A1 | 2/2002 | Kim et al. | |
| 2004/0004284 | A1 | 1/2004 | Lee et al. | |
| 2004/0198057 | A1 | 10/2004 | Huang et al. | |
| 2006/0234516 | A1 | 10/2006 | Hong et al. | |
| 2007/0126120 | A1 | 6/2007 | Tsao et al. | |
| 2009/0127682 | A1 | 5/2009 | Kim et al. | |
| 2010/0109161 | A1 | 5/2010 | Schuehrer et al. | |
| 2011/0209899 | A1 | 9/2011 | Hill | |
| 2017/0294348 | A1 | 10/2017 | Mebarki et al. | |
| 2017/0352678 | A1 | 12/2017 | Lu et al. | |
| 2019/0164917 | A1 * | 5/2019 | Huang | ................. H01L 21/768 |
| 2019/0273057 | A1 | 9/2019 | Ogata | |
| 2019/0326215 | A1 | 10/2019 | Reznicek et al. | |
| 2020/0006334 | A1 | 1/2020 | Hsueh et al. | |
| 2020/0091096 | A1 | 3/2020 | Huang et al. | |
| 2021/0098399 | A1 * | 4/2021 | Huang | ................... H01L 24/03 |

* cited by examiner

200

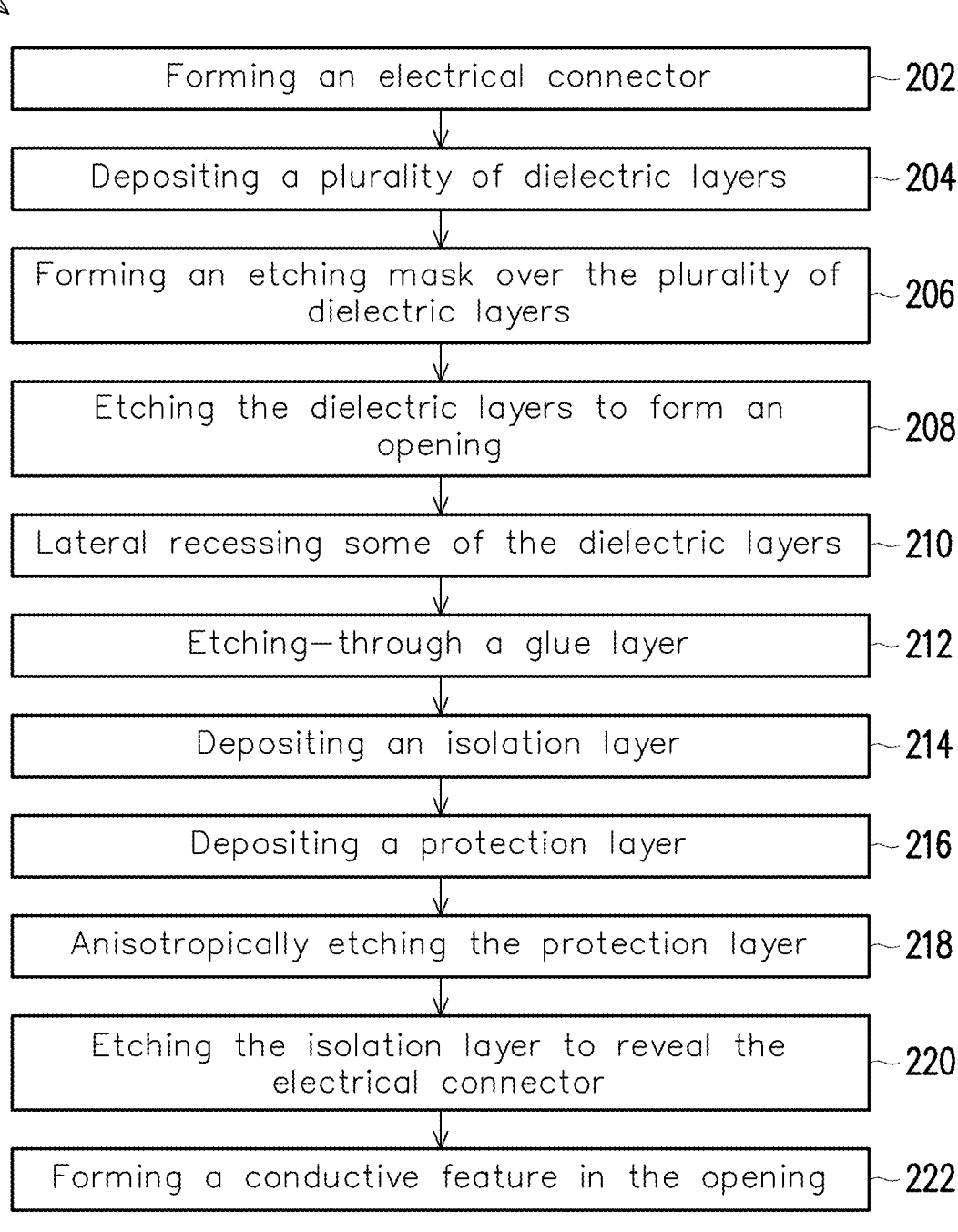

| Forming an electrical connector | ~202 |

| Depositing a plurality of dielectric layers | ~204 |

| Forming an etching mask over the plurality of dielectric layers | ~206 |

| Etching the dielectric layers to form an opening | ~208 |

| Lateral recessing some of the dielectric layers | ~210 |

| Etching-through a glue layer | ~212 |

| Depositing an isolation layer | ~214 |

| Depositing a protection layer | ~216 |

| Anisotropically etching the protection layer | ~218 |

| Etching the isolation layer to reveal the electrical connector | ~220 |

| Forming a conductive feature in the opening | ~222 |

FIG. 14

PASSIVATION STRUCTURE WITH INCREASED THICKNESS FOR METAL PADS

PRIORITY CLAIM AND CROSS-REFERENCE

This application is a continuation of U.S. patent application Ser. No. 17/818,736, entitled "Passivation Structure with Increased Thickness for Metal Pads," filed on Aug. 10, 2022, which is a divisional of U.S. patent application Ser. No. 17/100,010, entitled "Passivation Structure with Increased Thickness for Metal Pads," filed on Nov. 20, 2020, now U.S. Pat. No. 11,532,579, issued Dec. 20, 2022, which claims the benefit of the U.S. Provisional Application No. 63/051,011, filed on Jul. 13, 2020, and entitled "A New Passivation Design for MONOS Structure," which applications are hereby incorporated herein by reference.

BACKGROUND

In the formation of integrated circuits, integrated circuit devices such as transistors and memory cells are formed on semiconductor substrates. Metal pads are often formed to electrically connect to the integrated circuits, so that solder balls, metal bumps, wire-bonding studs, or the like may be formed on the metal pads in order to electrically couple external devices to the integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 14 illustrates a process flow for forming an isolation structure in a package component in accordance with some embodiments.

DETAILED DESCRIPTION

Figure 1:
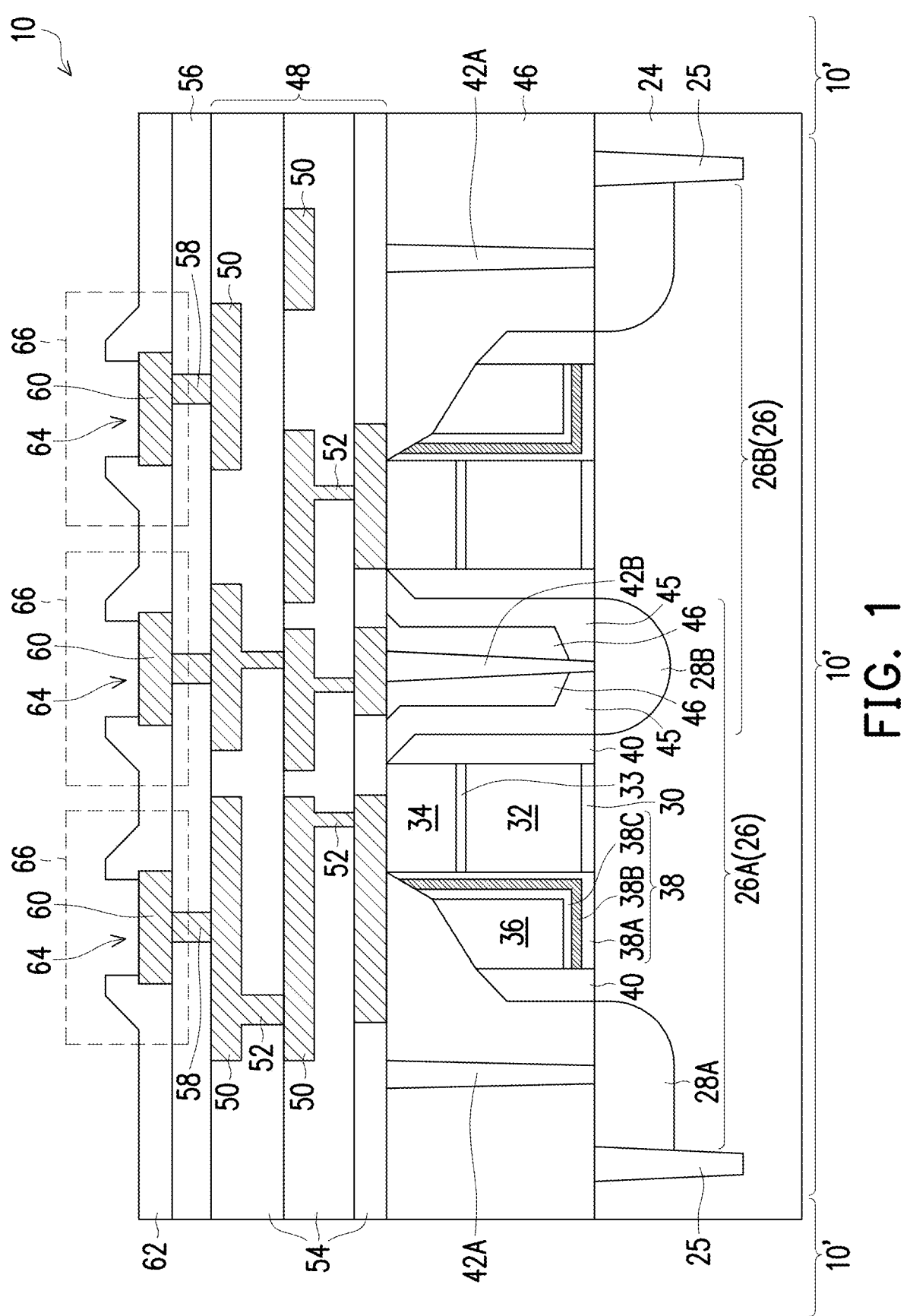
FIG. 1 illustrates a cross-sectional view of a package component in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package component including metal pads and isolation structures, and the method of forming the same are provided. In accordance with some embodiments of the present disclosure, a metal pad is formed over an interconnect structure of a package component. A plurality of dielectric layers is deposited, and are then patterned to reveal the metal pad. An isotropic etching process may be performed to recess the materials that are lighter (less dense) more than the dense materials in the plurality of the dielectric layers. An isolation layer, which has good moisture-isolation ability, is deposited. A protection layer is then deposited on the isolation layer. The isolation layer and the protection layer are patterned to leave portions on the sidewalls of the plurality of dielectric layers. The protection layer prevents the isolation layer from being thinned in the patterning and the subsequent cleaning process. Furthermore, the isolation layer is able to have greater thicknesses on the sidewalls of the lighter dielectric layers, and hence provides better isolation to the lighter dielectric layers. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1, 2A, 2B, 3A, 3B, 4A, 4B, 5A, 5B, 6A, 6B, 7A, 7B, 8A, 8B, 9A, and 9B illustrate the cross-sectional views of a package component and intermediate stages in the formation of an isolation structure on a conductive pad in the package component in accordance with some embodiments of the present disclosure. The corresponding processes are also reflected schematically in the process flow 200 as shown in FIG. 14.

Referring to FIG. 1, package component 10 is formed. In accordance with some embodiments, package component 10 is a device wafer, which includes integrated circuits (with active devices such as transistors, memory devices, etc.) therein. The device wafer further includes a plurality of identical device dies 10' therein. In accordance with alternative embodiments, package component 10 comprises an interposer wafer, a reconstructed package including a plurality of device dies therein, or the like. In subsequent discussion, a device die/wafer is used as an example of package component 10, while package component 10 may also be other types of package components.

In accordance with some embodiments of the present disclosure, package component 10 includes semiconductor substrate 24 and the features formed at a surface of semiconductor substrate 24. Semiconductor substrate 24 may be formed of or comprise crystalline silicon, crystalline germanium, silicon germanium, carbon-doped silicon, or a III-V compound semiconductor such as GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions 25 may be formed in semiconductor substrate 24 to isolate different regions and devices in semiconductor substrate 24. Although not shown, through-vias may (or may not) be formed to extend into semiconductor substrate 24, wherein the through-vias are used to electrically inter-couple the features on opposite sides of wafer 10.

In accordance with some embodiments of the present disclosure, wafer 10 includes integrated circuit devices 26, which are formed at the top surface of semiconductor substrate 24. Integrated circuit devices 26 may include Complementary Metal-Oxide Semiconductor (CMOS) transistors, resistors, capacitors, diodes, and/or the like in accordance with some embodiments. The details of integrated circuit devices 26 are not illustrated herein. In accordance with alternative embodiments, wafer 10 is used for forming interposers (which are free from active devices), and substrate 24 may be a semiconductor substrate or a dielectric substrate.

Integrated circuit devices 26 may include memory cells 26A and 26B and transistors (not shown) in accordance with some embodiments. Memory cells 26A and 26B may be symmetric to each other relative to the middle line of drain region 28B. Accordingly, the structure of memory cell 26A is discussed below, and memory cell 26B, which has the same structure as memory cell 26A, is not discussed. Memory cell 26A includes source region 28A and drain region 28B. Drain region 28B is a common drain region shared by memory cells 26A and 26B. Gate dielectric 30 is formed over substrate 24. In accordance with some embodiments, gate dielectric 30 comprises silicon oxide, a high-k dielectric material such as $HfO_2$, $La_2O_3$, or the like, or composite layers thereof. Select gate 32 is formed over gate dielectric 30. Select gate 32 may be formed of polysilicon, metal, metal alloy, or the like. Dielectric layer 33 and dielectric mask 34 are formed over select gate 32.

Control gate 36 is formed over semiconductor substrate 24, and is separated from semiconductor substrate 24 and gate stack 30/32/33/34 by stacked layers 38. Control gate 36 is formed of a conductive material such as metal or a metal alloy, polysilicon, or the like. Stacked layers 38 include dielectric layer 38A, charge trapping layer 38B, and dielectric layer 38C. In accordance with some embodiments, dielectric layers 38A and 38C are formed of silicon oxide, which are used to electrically isolate charge trapping layer 38B from substrate 24 and select gate 32. Charge trapping layer 38B may be formed of silicon nitride, which is capable of holding charges. Charge trapping layer 38B may also be formed of a conductive material such as polysilicon. Gate spacers 40 are formed on the sidewalls of control gate 36 and select gate 32. Source contact plug 42A and drain contact plug 42B are connected to source region 28A and drain region 28B, respectively. Contact Etch Stop Layer (CESL) 45 and Inter-Layer Dielectric 46 are also illustrated.

Contact Etch Stop Layer (CESL) 45 and Inter-Layer Dielectric (ILD) 46 fill the spaces between the gate stacks of transistors and memory cells in integrated circuit devices 26. In accordance with some embodiments, CESL 45 is formed of silicon oxide, silicon nitride, or the like. ILD 46 may be formed of silicon oxide, Phospho Silicate Glass (PSG), Boro Silicate Glass (BSG), Boron-doped Phospho Silicate Glass (BPSG), Fluorine-doped Silicate Glass (FSG), a low-k dielectric, or the like. ILD 46 may be formed using spin coating, Flowable Chemical Vapor Deposition (FCVD), or the like. In accordance with some embodiments of the present disclosure, ILD 46 is formed using a deposition process such as Plasma Enhanced Chemical Vapor Deposition (PECVD), Low Pressure Chemical Vapor Deposition (LPCVD), or the like.

Contact plugs 42A and 42B are formed in ILD 46, and are used to electrically connect source region 28A and drain region 28B, respectively, to overlying metal lines and vias. In accordance with some embodiments of the present disclosure, contact plugs 42A and 42B are formed of or comprise a conductive material selected from tungsten, aluminum, copper, titanium, tantalum, titanium nitride, tantalum nitride, alloys thereof, and/or multi-layers thereof. The formation of contact plugs 42A and 42B may include forming contact openings in ILD 46, filling a conductive material(s) into the contact openings, and performing a planarization process (such as a Chemical Mechanical Polish (CMP) process or a mechanical grinding process) to level the top surfaces of contact plugs 42A and 42B with the top surface of ILD 46.

Over ILD 46 and contact plugs 42A and 42B reside interconnect structure 48. Interconnect structure 48 includes metal lines 50 and vias 52, which are formed in dielectric layers 54 (also referred to as Inter-metal Dielectrics (IMDs)). The metal lines 50 at a same level are collectively referred to as a metal layer hereinafter. In accordance with some embodiments of the present disclosure, interconnect structure 48 includes a plurality of metal layers including metal lines 50 that are interconnected through vias 52. Metal lines 50 and vias 52 may be formed of copper, a copper alloy, Ti, TiN, Ta TaN, and composite layers thereof. In accordance with some embodiments of the present disclosure, dielectric layers 54 are formed of low-k dielectric materials. The dielectric constants (k values) of the low-k dielectric materials may be lower than about 3.0, for example. Dielectric layers 54 may comprise a carbon-containing low-k dielectric material, Hydrogen SilsesQuioxane (HSQ), MethylSilsesQuioxane (MSQ), or the like.

The formation of metal lines 50 and vias 52 in dielectric layers 54 may include single damascene processes and/or dual damascene processes. In a single damascene process for forming a metal line or a via, a trench or a via opening is first formed in one of dielectric layers 54, followed by filling the trench or the via opening with a conductive material. A planarization process such as a CMP process is then performed to remove the excess portions of the conductive material higher than the top surface of the dielectric layer, leaving a metal line or a via in the corresponding trench or via opening. In a dual damascene process, both of a trench and a via opening are formed in a dielectric layer, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, or the like.

Passivation layer 56 (sometimes referred to as passivation-1 or pass-1) may be formed over interconnect structure 48. In accordance with some embodiments, passivation layer 56 is formed of a non-low-k dielectric material with a dielectric constant greater than the dielectric constant of silicon oxide. Passivation layer 56 may be formed of or comprise an inorganic dielectric material, which may include a material selected from, and is not limited to, silicon nitride (SiN), silicon oxide (SiO$_2$), silicon oxy-nitride (SiON), silicon oxy-carbide (SiOC), silicon carbide (SiC), or the like, combinations thereof, and multi-layers thereof.

In subsequent processes, vias 58 and electrical connectors 60 are formed. In accordance with some embodiments, electrical connectors 60 are formed of or comprise a homogeneous material such as aluminum, aluminum copper (AlCu), copper, or the like. An electrical connector 60 may also have a composite structure comprising a conductive pad 60A (FIG. 2A) and a glue layer 60B over the conductive pad 60A. The conductive pad 60A may be formed of or comprise copper, aluminum, aluminum copper, nickel, palladium, gold, or the like, alloys thereof, and multilayers thereof. The glue layer 60B may comprise titanium, titanium nitride, tantalum, tantalum nitride, or the like.

In accordance with some embodiments, the formation of vias 58 and electrical connectors 60 includes forming vias in passivation layer 68 using a single damascene process. Next, a conductive layer is deposited, followed by an etching process to pattern the conductive layer and to form electrical connectors 60. In accordance with alternative embodiments, the formation of vias 58 and electrical connectors 60 includes etching passivation layer 56 to form via openings, depositing a blanket metal seed layer extending into the via openings, forming a patterned plating mask (such as a photo resist) to reveal the via openings, and then performing a plating process to plate vias 58 and electrical connectors 60. The blanket metal seed layer may comprise a copper layer, or a titanium layer and a copper layer over the titanium layer. The plating process may include an electrochemical plating process. The plating mask is then removed, followed by an etching process to remove the portions of the metal seed layer previously covered by the plating mask.

After the formation of electrical connectors 60, a plurality of dielectric layers is deposited, with some portions of the dielectric layers forming parts of isolation structures 66. Each of isolation structures 66 is used for isolating one of electrical connectors 60. Isolation structures 66 are used for isolating detrimental substances such as hydrogen, moisture, or the like from penetrating to the underlying features such as memory cells 26 and low-k dielectric layers. For example, memory cells 26 are sensitive to the damage caused by hydrogen and moisture. The low-k dielectric layers 54 in interconnect structure 48 also form a good penetration paths for the hydrogen and moisture, so that the features inside or below the interconnect structure such as the metal lines 50, vias 52 and the devices 26 may be damaged. Accordingly, isolation structures 66 are formed to have improved resistance to the penetration of the detrimental substances. An example formation process of isolation structures 66 is shown in FIGS. 2A, 2B, 3A, 3B, 4A, 4B, 5A, 5B, 6A, 6B, 7A, 7B, 8A, 8B, 9A, and 9B, with the portions shown in the illustrated dashed boxes in FIG. 1 being illustrated, while other features are not reproduced in these figures.

Figure 2A:
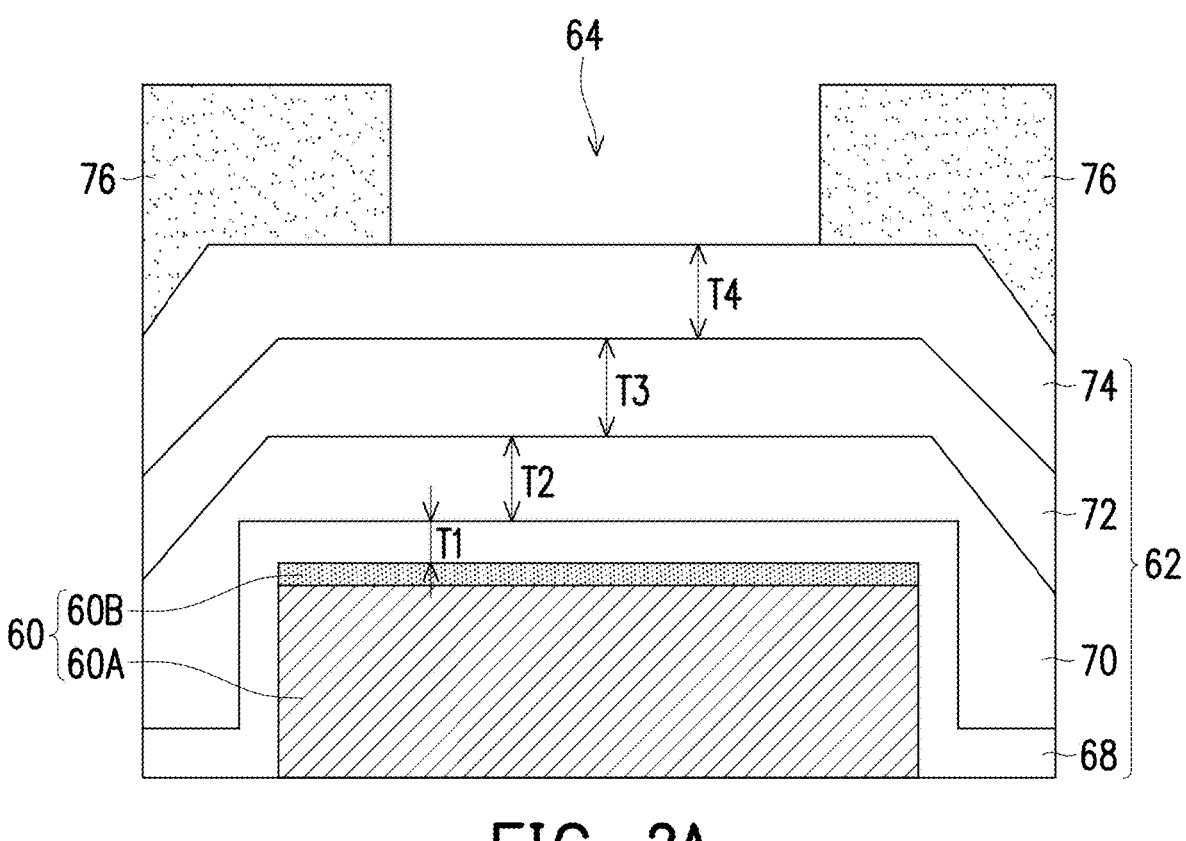
FIGS. 2A, 2B, 3A, 3B, 4A, 4B, 5A, 5B, 6A, 6B, 7A, 7B, 8A, 8B, 9A, and 9B illustrate the cross-sectional views of intermediate stages in the formation of an isolation structure in accordance with some embodiments.
Figure 2B:
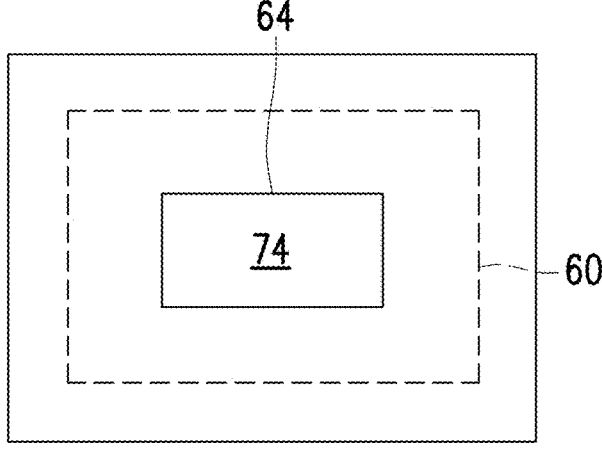

FIGS. 2A and 2B illustrate a cross-sectional view and a top view, respectively, in the formation of a plurality of dielectric layers and the formation of an etching mask. Referring to FIG. 2A, electrical connector 60, which includes conductive pad 60A and glue layer 60B, is formed. The respective process is illustrated as process 202 in the process flow 200 as shown in FIG. 14. The formation process may include a deposition-and-patterning process or a plating process, as aforementioned. In accordance with some embodiments, the glue layer 60B is over and contacting conductive pad 60A, with edges of the glue layer 60B being flush with the respective edges of conductive pad 60A. Glue layer 60B is also referred to as a barrier layer or an etch stop layer.

A plurality of dielectric layers 68, 70, 72, and 74 are then deposited. The respective process is illustrated as process 204 in the process flow 200 as shown in FIG. 14. Passivation layer 68 (sometimes referred to as passivation-2 or pass-2) is deposited on electrical connector 60, and may extend on the top surface and the sidewalls of electrical connector 60. Passivation layer 68 is formed as a blanket layer. In accordance with some embodiments, passivation layer 68 is formed of or comprises an inorganic dielectric material, which may include, and is not limited to, silicon oxide, silicon oxy-carbide, silicon carbide, or the like. For example, passivation layer 68 may be formed of silicon oxide using Tetraethyl Orthosilicate (TEOS) as a precursor. The material of passivation layer 68 may be the same or different from the material of passivation layer 56. The deposition process may be performed through a conformal deposition process such as Atomic Layer Deposition (ALD), CVD, or the like. Accordingly, the vertical portions and horizontal portions of passivation layer 68 have the same thickness or substantially the same thickness, for example, with a variation smaller than about 20 percent or smaller than about 10 percent. The bottom surface of passivation layer 68 may be in physical contact with the top surface of passivation layer 56, as shown in FIG. 1. In accordance with some embodiments, thickness T1 of passivation layer 68 is in the range between about 0.18 μm and about 0.22 μm.

Next, dielectric layer 70 is deposited. In accordance with some embodiments, dielectric layer 70 is deposited using a non-conformal deposition process, which may include High Density Plasma Chemical Vapor Deposition (HDPCVD), Plasma Enhanced Chemical Vapor Deposition (PECVD), or the like. The deposited material may include silicon oxide, silicon nitride, silicon oxy-nitride, silicon oxy-carbide, silicon carbide, or the like. In accordance with some embodiments in which dielectric layer 70 is formed of or comprises silicon oxide, silicon-containing precursors such as silane, disilane, dichlorosilane, or the like may be used. The top surface of dielectric layer 70 has smaller topology (smoother with less-severe ups and downs) than the top surface of dielectric layer 68 due to the adoption of the non-conformal deposition process. In accordance with some embodiments, thickness T2 of dielectric layer 70 is in the range between about 0.81 μm and about 0.99 μm.

Dielectric layer 72 is formed over dielectric layer 70. In accordance with some embodiments, dielectric layer 72 is deposited using a non-conformal deposition process or a conformal deposition process, which may include ALD, CVD, Sub-Atmospheric Pressure Chemical Vapor Deposition (SACVD), PECVD, or the like. The deposited material may include Undoped Silicate Glass (USG), silicon oxide, silicon oxy-carbide, silicon carbide, or the like. In accordance with some embodiments, thickness T3 of dielectric layer 72 is in the range between about 0.72 μm and about 0.88 μm.

Dielectric layer 74 is further deposited over dielectric layer 72. In accordance with some embodiments, dielectric layer 74 is deposited using a non-conformal deposition process or a conformal deposition process, which may include ALD, CVD, Low-Pressure Chemical Vapor Deposition (LPCVD), PECVD, or the like. The deposited material has good isolation ability for preventing detrimental substances such as hydrogen and moisture from penetrating through. Accordingly, dielectric layer 74 is also referred to as an isolation layer. Dielectric layer 74 may include silicon nitride, silicon oxynitride, or the like. In accordance with some embodiments, thickness T4 of dielectric layer 74 is in the range between about 0.54 μm and about 0.66 μm. Throughout the description, the plurality of dielectric layers 68, 70, 72, and 74 are collectively referred to as dielectric stack 62.

It is appreciated that the above-discussed dielectric layers 68, 70, 72, and 74 in dielectric stack 62 and their formation methods are examples, and different materials and different formation methods are contemplated by the present disclosure. Also, dielectric stack 62 may include more or fewer layers, and/or may have the layers formed in different orders than discussed.

In accordance with some embodiments, the dielectric layers in dielectric stack 62 may be formed of the same material as each other or different materials from each other, and may have the same density as each other or have different densities from each other. For example, assuming dielectric layer 70 is formed of silicon oxide using HDPCVD, and dielectric layers 68 and 72 are formed of silicon oxide (using TEOS) and USG, respectively, using CVD, dielectric layer 70 may have a higher density than dielectric layers 68 and 72. In accordance with other embodiments, the relative densities and materials of the dielectric layers in dielectric stack 62 may have any other combinations. For example, the density of dielectric layer 68 may be greater than, or smaller than, that of dielectric layers 70 and 72 in accordance with some embodiments. Also, the material of some of dielectric layers (such as layers 68, 70, and 72) in dielectric stack 62 may be the same as each other or different from each other. For example, these layers may be formed of the same material silicon oxide (although may be formed using different methods), or may be formed of similar materials such as silicon oxide and USG.

Etching mask 76 is formed over dielectric stack 62, with opening 64 being formed directly over electrical connector 60. The respective process is illustrated as process 206 in the process flow 200 as shown in FIG. 14. In accordance with some embodiments, etching mask 76 is formed of or comprises a photo resist. A hard mask may or may not be formed underlying the photo resist. FIG. 2B illustrates a top view of electrical connector 60 and opening 64. Electrical connector 60 extends laterally beyond edges of opening 64.

Figures 3A, 3B:
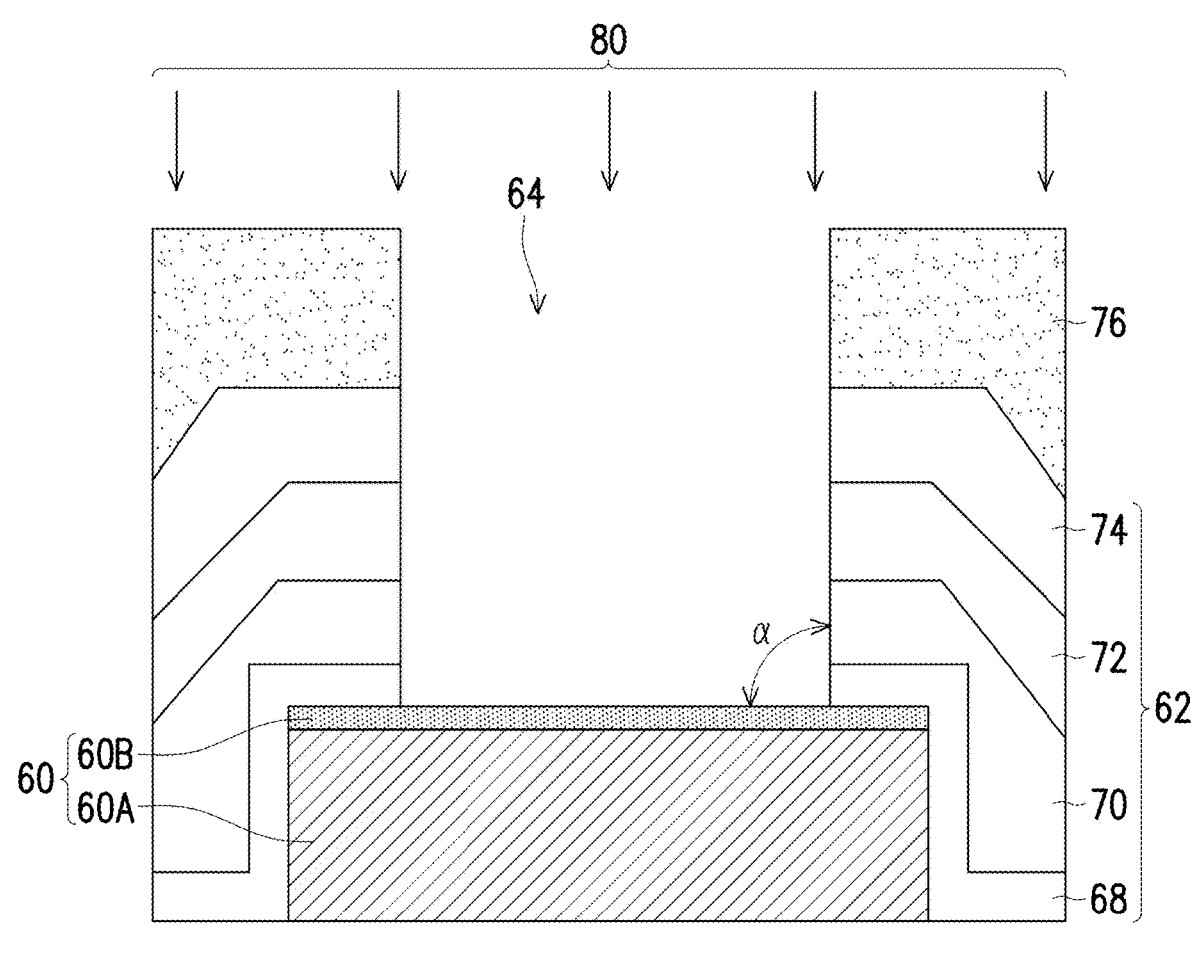

Referring to FIGS. 3A and 3B, etching processes 80 are performed to etch-through dielectric stack 62, so that opening 64 extends into dielectric stack 62. The respective process is illustrated as process 208 in the process flow 200 as shown in FIG. 14. FIGS. 3A and 3B illustrate a cross-sectional view and a top view, respectively. In accordance with some embodiments, etching processes 80 are performed through a plurality of Reactive Ion Etching (RIE) processes using different etching gases. The etching gases are selected depending on the materials of the dielectric layers (such as layers 74, 72, 70 and 68) in dielectric stack 62. For example, dielectric layer 74, when formed of or comprising silicon nitride, may be etched using a fluorine-containing gas such as the mixture of $CF_4$, $O_2$, and $N_2$, the mixture of $NF_3$ and $O_2$, $SF_6$, the mixture of $SF_6$ and $O_2$, or the like, or combinations thereof. Dielectric layers 72, 70, and 68, when formed of or comprising silicon oxide, may be etched using process gases including, for example, SiCONI (a mixture of $NF_3$ and $NH_3$), Certas (a mixture of HF and $NH_3$), or the like, or combinations thereof.

The etching processes 80 are anisotropic, so that the exposed sidewalls of dielectric layers 74, 72, 70 and 68 are vertical or substantially vertical, for example, with tilt angle α being in the range between about 75 degrees and about 100 degrees. The exposed sidewalls of dielectric layers 74, 72, 70 and 68 may also be straight (either vertical or slanted). The etching processes 80 may be performed using glue layer 60B as an etch stop layer. Accordingly, the top surface of glue layer 60B is exposed after etching processes 80. In accordance with some embodiments, the anisotropic effect is achieved by applying a relatively high bias power, for example, higher than about 1,000 watts. The bias power may also be in the range between about 800 watts and about 1,200 watts.

Figures 4A, 4B:
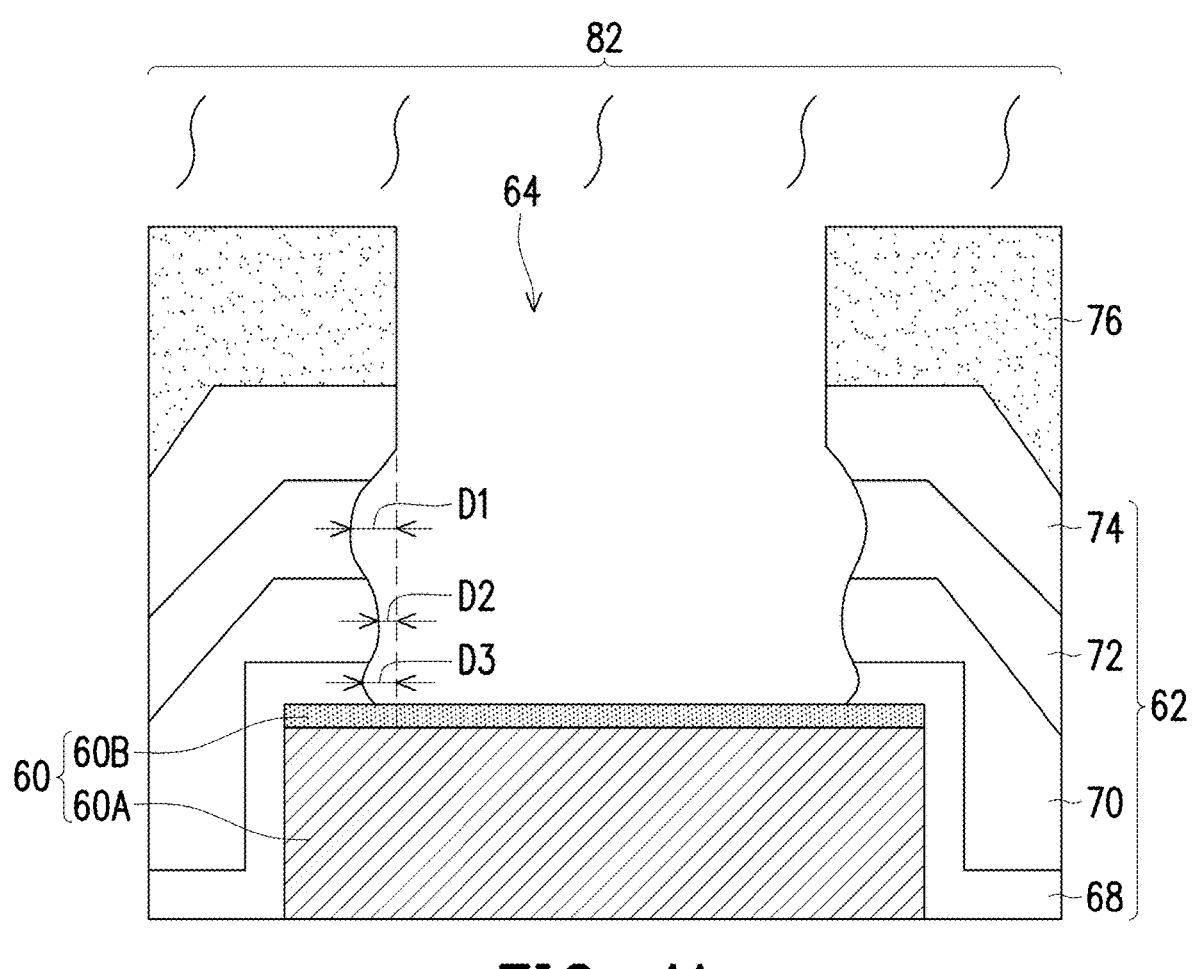

FIGS. 4A and 4B illustrate a cross-sectional view and a top view, respectively, of an isotropic etching process 82. The respective process is illustrated as process 210 in the process flow 200 as shown in FIG. 14. Etching process 82 may also use glue layer 60B as an etch stop layer. Etching process 82 is performed using an etching chemical that attacks the layers in dielectric stack 62 that are penetration-prone to the detrimental substances, but does not attack penetration-resistant layer(s) (such as layer 74) in dielectric stack 62. For example, silicon nitride is more penetration-resistant than silicon oxide. According, the etching gas is selected to have a higher etching rate to the materials (such as silicon oxide and USG) that are more penetration-prone than the materials (such as silicon nitride) that are more penetration-resistant. Depending on the material and the etching gas used in etching process 82, dielectric layer 74 is not recessed laterally, or substantially not recessed laterally, for example, with the lateral recessing distance being smaller than about 0.1 μm. In accordance with alternative embodiments, dielectric layer 74 is also laterally recessed, but with a recessing distance being smaller than the recessing distances of dielectric layers 68, 70, and 72.

In accordance with some embodiments, etching process 82 is performed through a wet etching process. For example, diluted HF solution may be used. In accordance with alternative embodiments, etching process 82 is achieved through a dry etching process, and either no bias power, or a low bias power. In accordance with some embodiments, the etching gas may be selected from the mixture of $NF_3$ and $NH_3$, the mixture of HF and $NH_3$, or the like, or combinations thereof.

The etching is self-adjusting to the penetration-prone dielectric layers such as dielectric layers 68, 70, and 72. In the subsequent discussion, it is assumed that dielectric 68, 70, and 72 are formed of TEOS oxide (silicon oxide), HDPCVD oxide (silicon oxide), and USG, respectively, although each of these layers may be formed of a different material. Since TEOS oxide layer 68 and USG layer 72 are lighter (less dense) than HDPCVD oxide 70, the etching rates of TEOS oxide layer 68 and USG layer 72 are greater than the etching rate of HDPCVD oxide 70. This results in TEOS oxide layer 68 and USG layer 72 to be laterally recessed more than HDPCVD oxide 70. Materials with lower densities values are more penetration-prone than the materials with higher densities. For example, the TEOS oxide and USG, due to their lower density than the HDPCVD oxide, is easier for the detrimental substances to penetrate-through than the HDPCVD oxide. As discussed in subsequent paragraphs, laterally recessing the lighter dielectric materials more than the denser dielectric materials is advantageous in forming an effective isolation structure.

In accordance with some embodiments, the etching selectivity values, which is the etching rates of relatively light dielectric layers 68 and 72 to the etching rate of relatively dense dielectric layer 70, are greater than about 2, and may be in the range between about 2 and about 10. For example, the etching selectivity values may be about 4 when dilute HF is used, and when dielectric layers 68, 72, and 70 are formed of TEOS oxide, USG, and HDPCVD oxide, respectively.

As a result of the etching process 82, dielectric layers 72, 70, and 68 are laterally recessed from the edges of dielectric layer 74 by distances D1, D2, and D3, respectively. In accordance with some embodiments, recessing distance D2 is equal to or smaller than recessing distance D1, and may be equal to or smaller than recessing distance D3. Furthermore, depending on the materials, distance D1 may be greater than, equal to, or smaller than, distance D3. For example, distance D1 may be greater than distance D3 when dielectric layers 72 and 68 are formed of USG and TEOS oxide, respectively. In accordance with some embodiments, recessing distance D1 is in the range between about 50 nm and about 500 nm, recessing distance D2 is in the range between about 50 nm and about 400 nm, and recessing distance D3 is in the range between about 50 nm and about 500 nm.

Figures 5A, 5B:
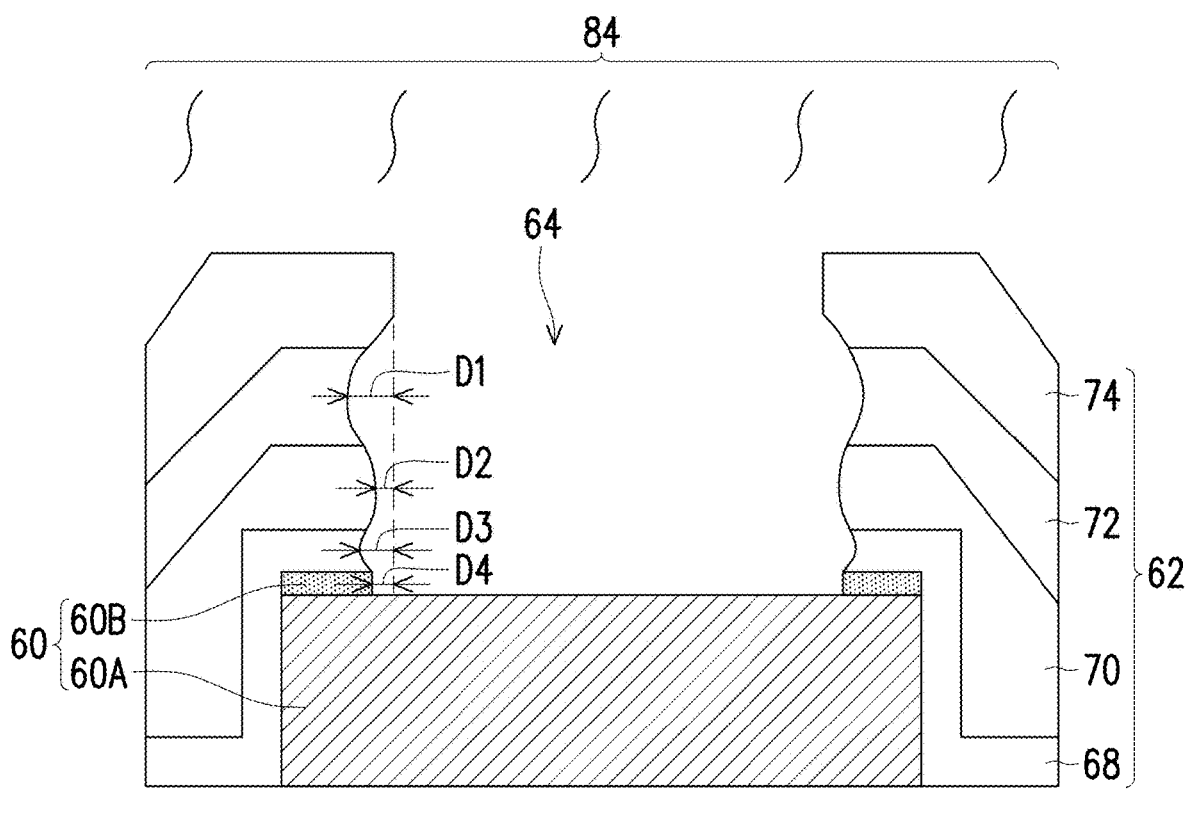

Next, glue layer 60B is etched-through in etching process 84. The respective process is illustrated as process 212 in the process flow 200 as shown in FIG. 14. Etching mask 76 is then removed. FIGS. 5A and 5B illustrate a cross-sectional view and a top view, respectively, of the resulting structure. Etching process 84 may be a wet etching process or a dry etching process, and may be an anisotropic etching process or an isotropic etching process, or an etching process with both of anisotropic etching effect and isotropic etching effect. Conductive pad 60A is thus exposed. Since glue layer 60B is thin and its material has significant difference from the materials of dielectric layers 68, 70, 72, and 74, dielectric layers 68, 70, 72, and 74 are not recessed. In accordance with some embodiments, the edge of glue layer 60B is laterally recessed from the corresponding edge of dielectric layer 74 by distance D4, which is in the range between about 5 nm and about 300 nm.

Figures 6A, 6B:
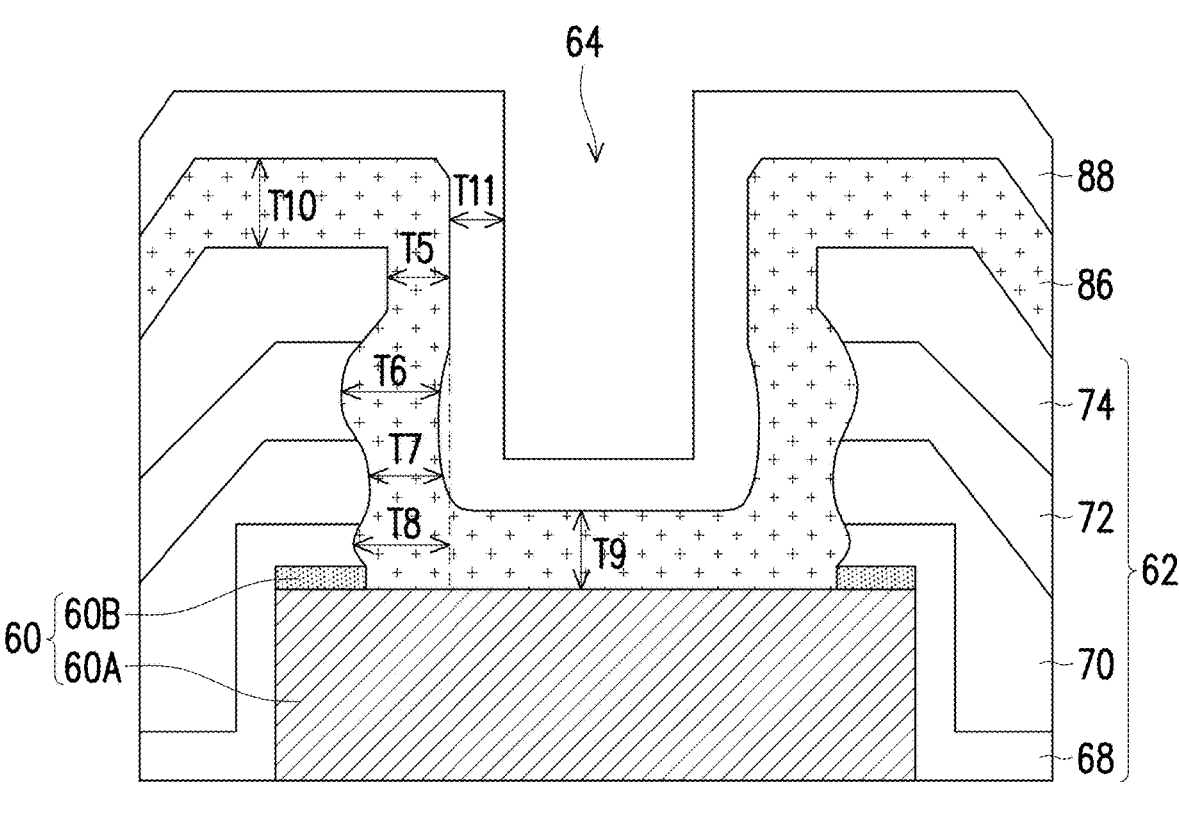

Referring to FIGS. 6A and 6B, which illustrate a cross-sectional view and a top view, respectively, isolation layer 86 is deposited. The respective process is illustrated as process 214 in the process flow 200 as shown in FIG. 14. Isolation layer 86 may be formed of a material that is penetration-resistant. For example, isolation layer 86 may be formed of silicon nitride, silicon oxynitride, or the like, or combinations thereof. The materials of isolation layers 86 and 74 may be the same as each other or different from each other. In accordance with some embodiments, isolation layer 86 is deposited using a selected deposition method so that the portions of isolation layer 86 is thicker where dielectric layers such as 68 and 72 are recessed more. Isolation layer 86 also has a substantially (but not fully) conformal profile, so that the bottom portion of isolation layer 86 at the bottom of opening 64 is not significantly thicker than other portions. For example, thicknesses T9 and T10 may be substantially equal to each other, for example, with variations smaller than about 20 percent. In accordance with some embodiments, isolation layer 86 is formed using PECVD, or the like.

In accordance with some embodiments, the portions of isolation layer 86 on the sidewalls of dielectric layers 74, 72, 70, and 68 have thicknesses T5, T6, T7, and T8, respectively, which may be in the range between about 0.5 μm and about 0.7 μm. In accordance with some embodiments, thickness T7 is smaller than thicknesses T6 and T8, and may be equal to or greater than thickness T5. Thickness T6 may be greater than, equal to, or smaller than, thickness T8. Thicknesses T6, T7, and T8 may be greater than thickness T5.

Protection layer 88 is deposited on isolation layer 86. The respective process is illustrated as process 216 in the process flow 200 as shown in FIG. 14. In accordance with some embodiments, protection layer 88 is deposited using a conformal deposition process such as ALD or CVD. The material of protection layer 88 is different from that of isolation layer 86, and may be formed of or comprise silicon oxide, silicon oxynitride, silicon carbide, silicon oxycarbide, or the like. The thickness T11 of protection layer 88 may be in the range between about 800 nm and about 1,000 nm.

Figure 7A:
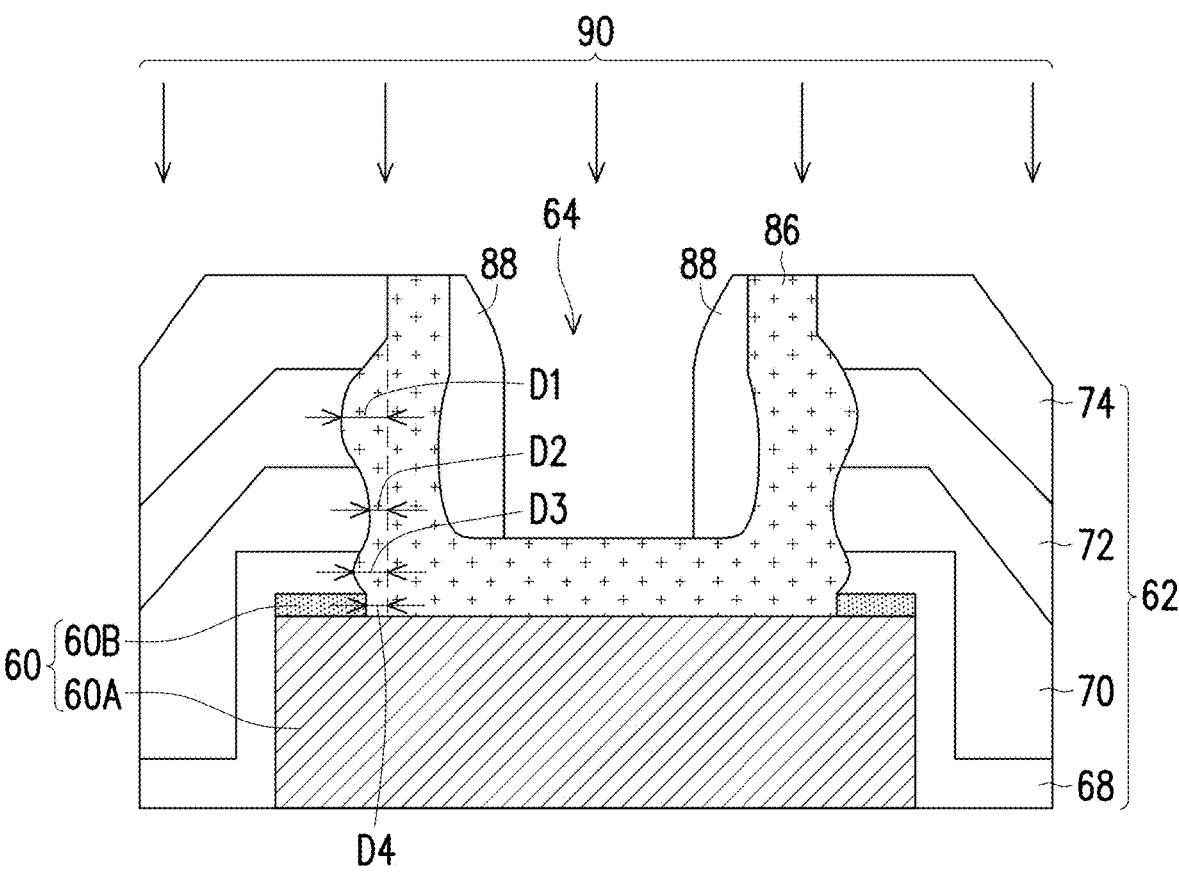
Figure 7B:
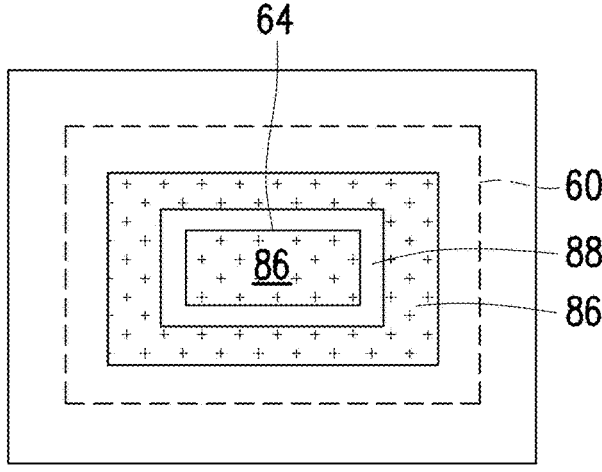

FIGS. 7A and 7B illustrates the cross-sectional view and the top view, respectively, of the structure formed after an anisotropic etching process 90, which is performed to etch protection layer 88. The respective process is illustrated as process 218 in the process flow 200 as shown in FIG. 14. The etching gas is selected so that protection layer 88 is etched, while isolation layer 86 is not etched. In accordance with some embodiments, the etching gas includes SiCONi or Certas. The horizontal portions of protection layer 88 are removed, while the vertical portions remain to form etching masks. As shown in FIG. 7B, the remaining protection layer 88 form a ring encircling the remaining portion of opening 64.

Figures 8A, 8B:
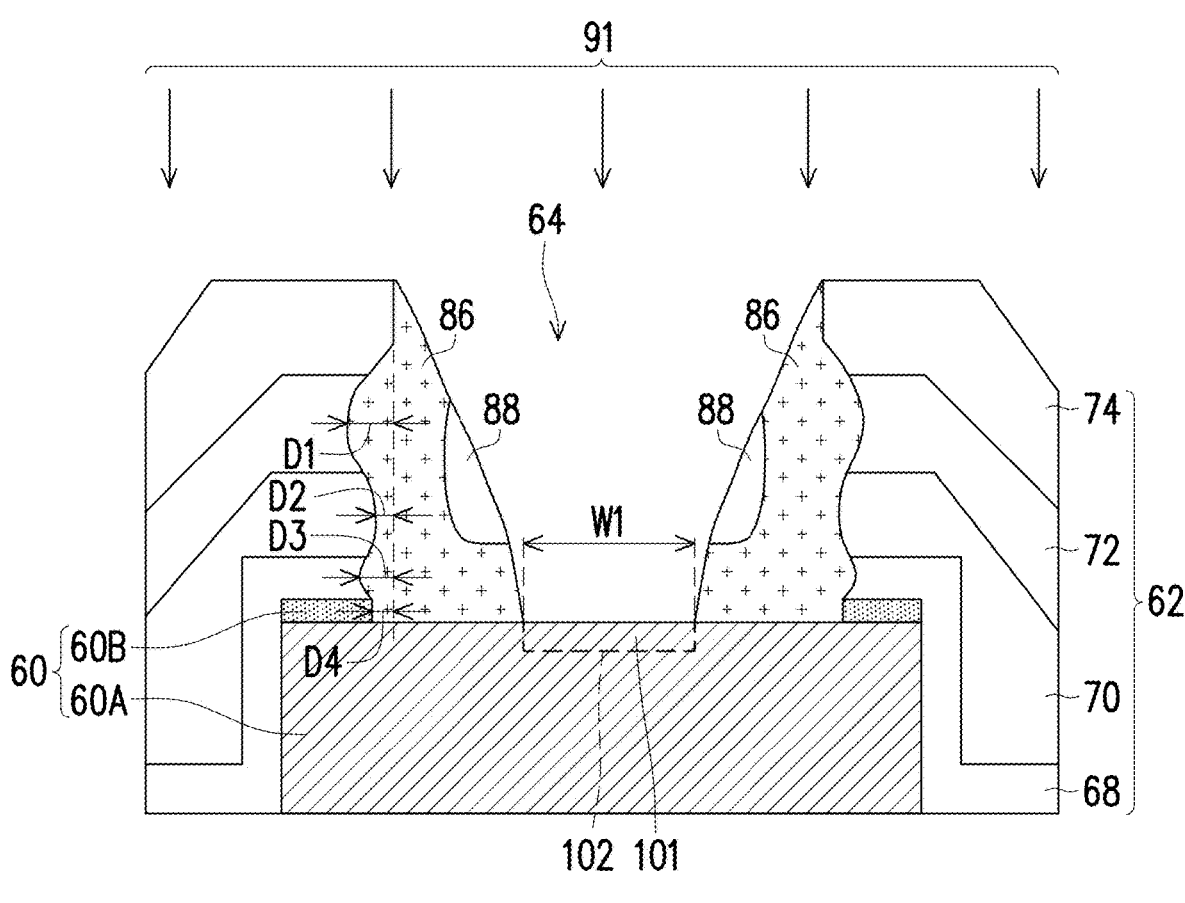

Next, referring to FIGS. 8A and 8B, a further anisotropic etching process 91 is performed to remove the exposed horizontal portions of isolation layer 86, so that conductive pad 60A is exposed. The respective process is illustrated as process 220 in the process flow 200 as shown in FIG. 14. Protection layer 88 acts as an etching mask, so that at the bottom of opening 64, the isolation layer 86 has a horizontal portion remaining, and the edge of isolation layer 86 is flush with the corresponding edge of protection layer 88. The use of protection layer 88 as the etching mask may protect the vertical portions of isolation layer 86 from being thinned. In accordance with some embodiments, the etching gas includes a fluorine-containing gas such as the mixture of $CF_4$, $O_2$, and $N_2$, the mixture of $NF_3$ and $O_2$, $SF_6$, the mixture of $SF_6$ and $O_2$, or the like. In accordance with some embodiments, the lateral dimension W1 of opening 64 is greater than about 50 μm.

Figure 9A:
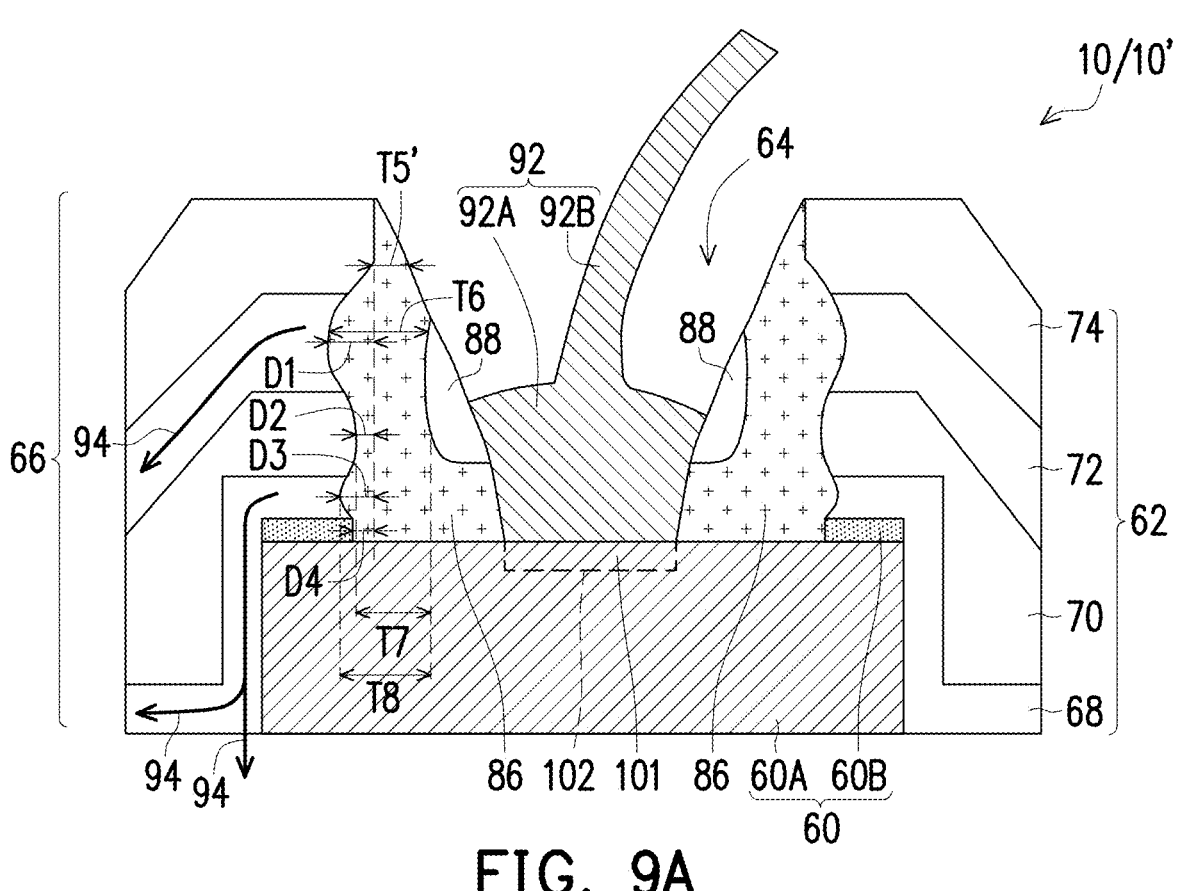
Figure 9B:
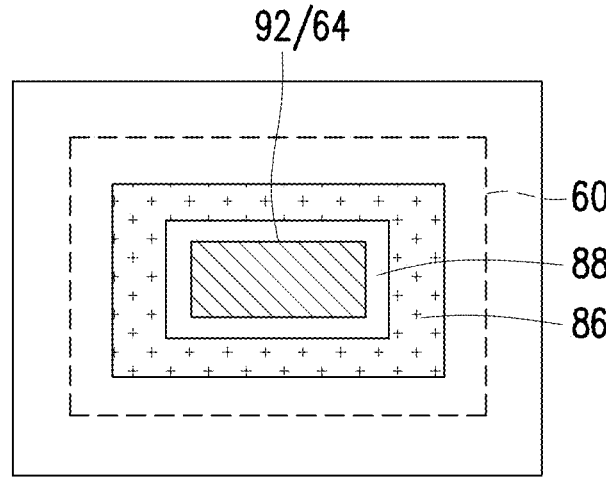

In subsequent processes, a conductive feature 92 may be formed to extend into opening 64, as shown in FIGS. 9A and 9B. The respective process is illustrated as process 222 in the process flow 200 as shown in FIG. 14. In accordance with some embodiments, conductive feature 92 includes a wire-bonding stud 92A, which is formed through wire bonding, and bond wire 92B attached to the wire-bonding stud 92A. In accordance with alternative embodiments, conductive feature 92 includes a metal bump such as a copper bump. In accordance with yet alternative embodiments, conductive feature 92 includes a solder ball. Wafer 10 may also be singulated in a die-saw process, so that dies (package components) 10' in wafer 10 (FIG. 1) are separated from each other. The formation of conductive feature 92 may be performed before or after the singulation process.

As shown in FIG. 9A, dielectric layers 72, 70, and 68 are recessed from the respective edge of dielectric layer 74 by recessing distances D1, D2, and D3, respectively, which are discussed in preceding paragraphs. Distances D1, D2, and D3 are also the widths of the portions of dielectric layers 72, 70, and 68 overlapped by dielectric layer 74. Thicknesses T6 and T8 are also advantageously greater than thickness T7 and thickness T5'. Since dielectric layers 68 are 72 are lighter and prone to the penetration of detrimental substances, which penetration paths are shown by arrows 94, making the portions of isolation layer 86 on the sidewalls of the penetration-prone dielectric layers to be thicker may effectively reduce the penetration of the detrimental substances. In addition, protection layer 88 also helps to reduce the penetration, while in conventional structures, since no protection layer 88 is formed, this part of the protection was not provided.

Figure 10:
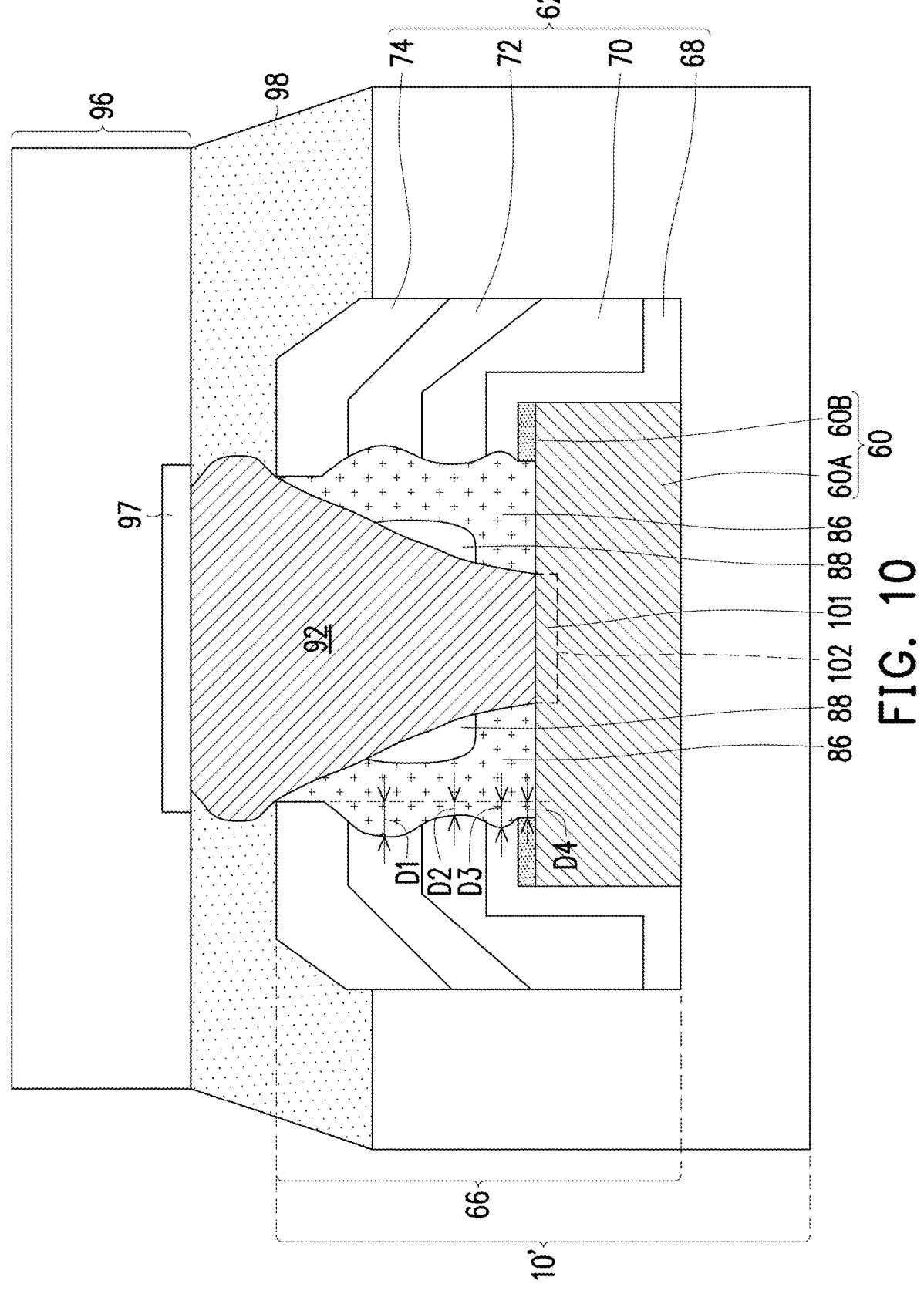
FIGS. 10 through 13 illustrate the cross-sectional views of isolation structures in a package component in accordance with some embodiments.

FIG. 10 illustrates an embodiment in which package component 10' is bonded to package component 96. In accordance with some embodiments, conductive feature 92 is a solder region (or a metal bump), which is joined to electrical connector 97 in package component 96. Underfill 98 is dispensed into the gap between package components 10' and 96.

Figure 11:
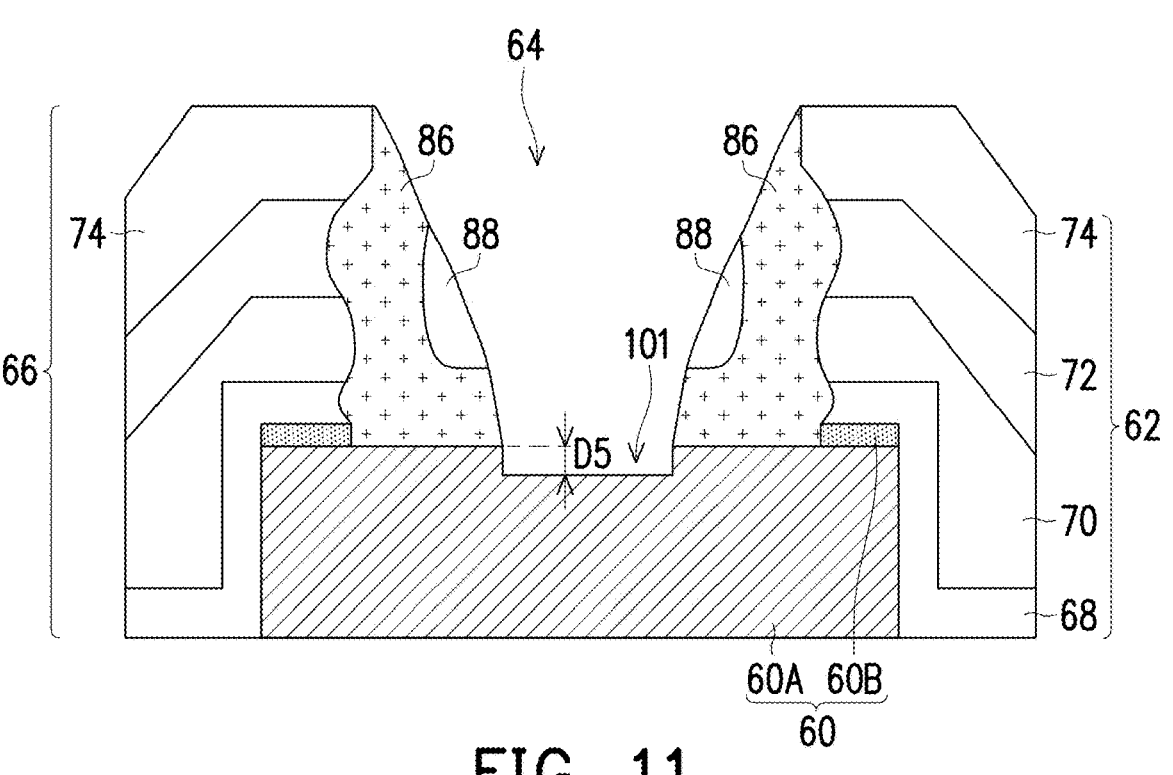
Figure 12:
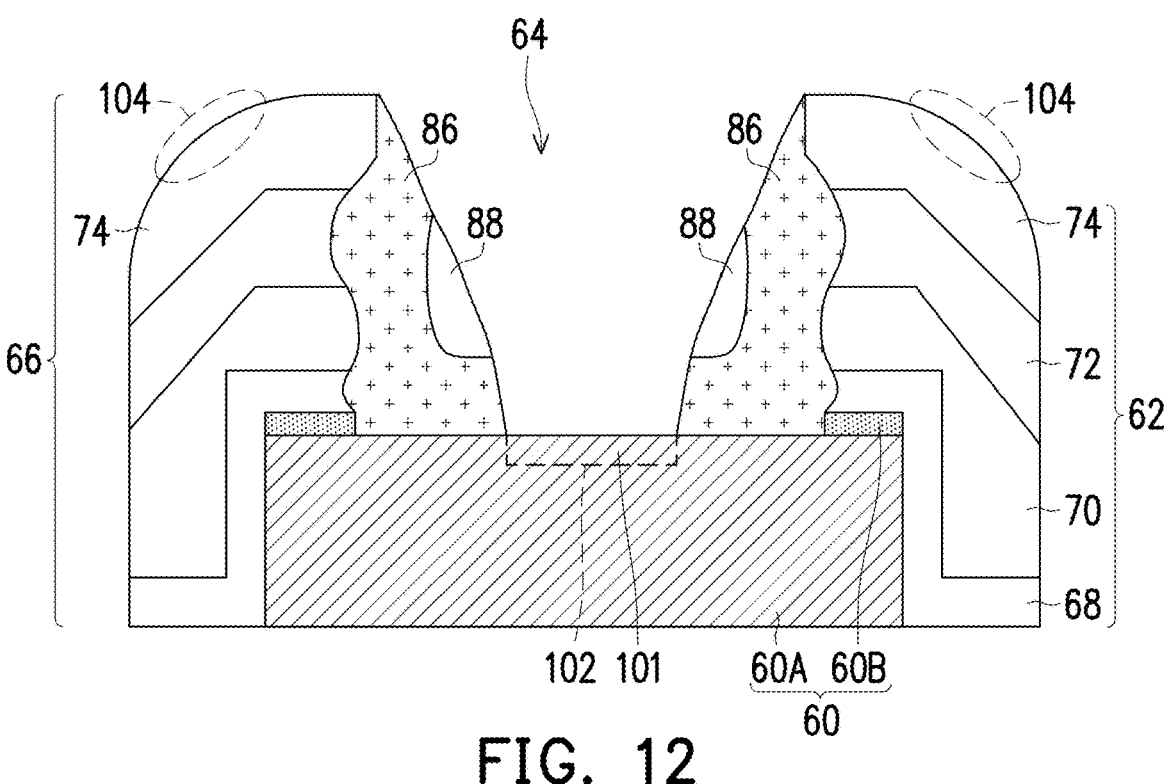
Figure 13:
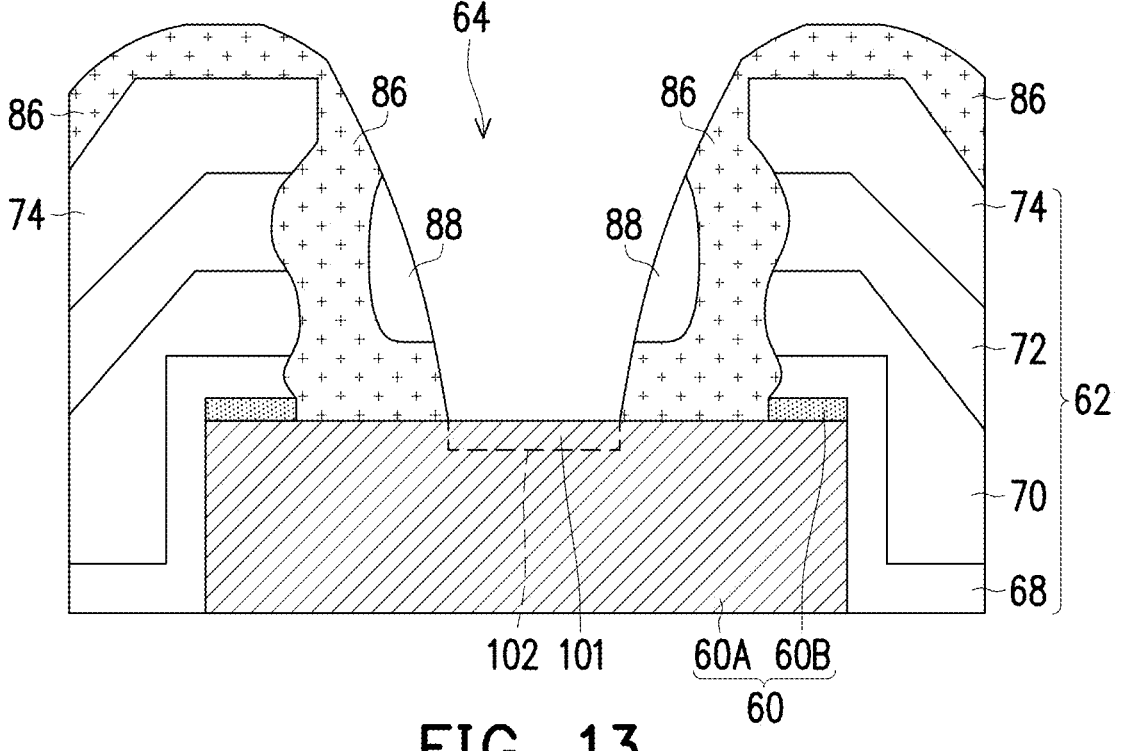

FIGS. 11 through 13 illustrate some details of isolation structure 66 in FIGS. 9A and 10 in accordance with some embodiments of the present disclosure. The conductive feature 92, package component 96, underfill 98, etc., as shown in FIGS. 9A and 10 are not shown in FIGS. 11 through 13, while these features may also exist. Referring to FIG. 11, in the etching process 90 (FIG. 7A), conductive pad 60A is also recessed by an over-etching process, so that recess 101 is formed extending into conductive pad 60A. Recess 101 have depth D5, which may be greater than about 0.01 μm, and may be in the range between about 0.005 μm and about 0.02 μm. Recess 101 may or may not be formed in the structures shown in FIGS. 9A and 11-13, and accordingly is illustrated using dashed lines 102 in these figures to represent the bottom and the sidewalls of recess 101.

FIG. 12 illustrates that the corners of dielectric layer 74 in regions 104 are rounded, which may be caused by the etching process 90 (FIG. 7A), and due to the similarity of the materials of dielectric layer 74 and isolation layer 86. FIG. 13 illustrates an embodiment in which the portions of isolation layer 86 on top of dielectric layer 74 remain in the final structure. Accordingly, isolation layer 86 and dielectric layer 74 join with each other. In each of FIGS. 12 and 13, recess 101 may or may not be formed.

The embodiments of the present disclosure have some advantageous features. In conventional isolation structures, there was a single layer formed on the sidewall of dielectric layers. In the embodiments of the present disclosure, a dual-layer isolation structure is formed to improve the isolation ability. The lateral recessing of the less-dense dielectric layers provides a self-adjusting ability to automatically provide greater isolation ability to the less-dense dielectric layers. Since the penetration paths in less-dense dielectric layers are connect to the underlying features (such as memory cells) that are prone to the damage of the detrimental substances, reliability of the resulting product is improved.

In accordance with some embodiments of the present disclosure, a method comprises depositing a first dielectric layer covering an electrical connector; depositing a second dielectric layer over the first dielectric layer; performing a first etching process to etch-through the second dielectric layer and the first dielectric layer, wherein an opening is formed in the first dielectric layer and the second dielectric layer to reveal the electrical connector; performing a second etching process to laterally etch the first dielectric layer and the second dielectric layer; depositing a first isolation layer extending into the opening, wherein the first isolation layer comprises a first vertical portion and a first horizontal portion in the opening, and a second horizontal portion overlapping the second dielectric layer; and performing a first anisotropic etching process on the first isolation layer, wherein the first vertical portion of the first isolation layer is left in the opening. In an embodiment, the method further comprises depositing a protection layer over the first isolation layer, wherein the protection layer extends into the opening; and performing a second anisotropic etching process on the protection layer, wherein a second vertical portion of the protection layer is left in the opening, and the first anisotropic etching process is performed using the second vertical portion as a part of an etching mask. In an embodiment, the method further comprises forming a conductive feature extending into the opening and contacting the electrical connector, wherein the conductive feature is in contact with the second vertical portion of the protection layer. In an embodiment, the first etching process comprises an anisotropic etching process, and the second etching process comprises an isotropic etching process. In an embodiment, the method further comprises, before the first etching process, depositing a second isolation layer over the second dielectric layer, wherein the second isolation layer is further etched in the first etching process to form the opening. In an embodiment, in the second etching process, the second isolation layer is not etched. In an embodiment, in the second etching process, a first one of the first dielectric layer and the second dielectric layer has a first etching rate, and a second one of the first dielectric layer and the second dielectric layer has a second etching rate different from the first etching rate, and a ratio of the first etching rate to the second etching rate is greater than about 2. In an embodiment, a first one of the first dielectric layer and the second dielectric layer comprises silicon oxide deposited using TEOS as a precursor, and a second one of the first dielectric layer and the second dielectric layer comprises silicon oxide deposited using high-density plasma Chemical vapor deposition. In an embodiment, after the first anisotropic etching process, a top edge of the first vertical portion of the first isolation layer is level with or lower than a top end of the opening. In an embodiment, after the first anisotropic etching process, the first isolation layer comprises a portion outside of the opening, and wherein the portion overlaps the second dielectric layer.

In accordance with some embodiments of the present disclosure, a structure comprises an electrical connector; a plurality of dielectric layers covering at least one edge portion of the electrical connector, wherein the plurality of dielectric layers comprise a first dielectric layer; a second dielectric layer overlying or underlying the first dielectric layer; and a first isolation layer over both of the first dielectric layer and the second dielectric layer; and a second isolation layer overlapping the electrical connector, wherein the second isolation layer comprises a sidewall contacting sidewalls of the first dielectric layer, the second dielectric layer, and the first isolation layer, and wherein the second isolation layer comprises a first portion overlapped by the first isolation layer, with the first portion having a first width; and a second portion overlapped by the first isolation layer, with the second portion having a second width different from the first width. In an embodiment, the first dielectric layer has a first density, and the second dielectric layer has a second density greater than the first density. In an embodiment, the first dielectric layer and the second dielectric layer comprise same elements. In an embodiment, the second isolation layer has a vertical leg and a horizontal leg connecting to a bottom end of the vertical leg, and wherein the structure further comprises a protection layer overlapping the vertical leg. In an embodiment, the structure further comprises a conductive feature over and contacting the electrical connector, wherein the conductive feature further contacts both of the protection layer and the horizontal leg. In an embodiment, the second isolation layer comprises a portion overlapping the second dielectric layer.

In accordance with some embodiments of the present disclosure, a structure comprises a metal pad; a plurality of oxide layers covering edge portions of the metal pad; a first nitride layer overlapping the plurality of oxide layers, wherein edges of the plurality of oxide layers are laterally recessed from respective edges of the first nitride layer in lateral directions toward edges of the metal pad; and a second nitride layer in an opening in the plurality of oxide layers and the first nitride layer, wherein the second nitride layer is in physical contact with both of the metal pad and the first nitride layer. In an embodiment, the second nitride layer has a top portion, and wherein lower portions of the top portion are increasingly wider than respective upper portions of the top portion. In an embodiment, the edges of the plurality of oxide layers are laterally recessed from the respective edges of the first nitride layer by different distances. In an embodiment, the plurality of oxide layers comprises a first oxide layer and a second oxide layer denser than the first oxide layer, and wherein a first edge of the first oxide layer is laterally recessed from a respective edge of the first nitride layer by a greater distance than the second oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a metal pad;
a plurality of dielectric layers covering at least one edge portion of the metal pad, wherein the plurality of dielectric layers comprise:
a first dielectric layer comprising a first portion contacting a sidewall of the metal pad, and a second portion directly over the metal pad;
a second dielectric layer overlying the first dielectric layer;
a third dielectric layer over the second dielectric layer, wherein the second dielectric layer is denser than the third dielectric layer; and
a fourth dielectric layer over the third dielectric layer, wherein the fourth dielectric layer is further denser than the third dielectric layer; and
an isolation layer overlapping the metal pad, wherein the isolation layer comprises a bottom contacting the metal pad, and a first sidewall contacting second sidewalls of the first dielectric layer, the second dielectric layer, the third dielectric layer, and the fourth dielectric layer.

2. The structure of claim 1, wherein the isolation layer is free from portions directly over the fourth dielectric layer.

3. The structure of claim 1, wherein the first dielectric layer has a first density, and the second dielectric layer has a second density greater than the first density.

4. The structure of claim 3, wherein the second dielectric layer further comprises a portion directly over the metal pad.

5. The structure of claim 1, wherein the isolation layer comprises a vertical leg and a horizontal leg connecting to a bottom end of the vertical leg, and wherein the structure further comprises a dielectric protection layer overlapping the horizontal leg.

6. The structure of claim 5 further comprising a conductive feature over and contacting the metal pad, wherein widths of upper portions of the conductive feature are greater than widths of respective lower portions of the conductive feature.

7. The structure of claim 1, wherein second sidewalls of the first dielectric layer and the second dielectric layer comprise:
a first part that is a sidewall of the first dielectric layer; and
a second part that is a sidewall of the second dielectric layer, wherein the first part is laterally recessed more toward an edge of the metal pad than the second part.

8. The structure of claim 1, wherein the isolation layer forms a ring encircling a space that is directly over a portion of the metal pad.

9. The structure of claim 8, wherein a topmost end of the isolation layer is higher than a topmost surface of the second dielectric layer.

10. The structure of claim 1, wherein the metal pad comprises:
a conductive pad; and
a conductive glue layer over and contacting the conductive pad, wherein the plurality of dielectric layers are separated from the conductive pad by the conductive glue layer, and wherein the isolation layer is in physical contact with a top surface of the conductive pad.

11. The structure of claim 1 further comprising a wire-bonding stud over and contacting the metal pad.

12. A structure comprising:
a metal pad;
a plurality of dielectric layers comprising upper portions covering at least one edge portion of the metal pad, wherein a bottom layer of the plurality of dielectric layers contacts a first top surface of the metal pad;
an isolation layer forming a ring in a top view of the structure, wherein the isolation layer is encircled by the upper portions of the plurality of dielectric layers, wherein the isolation layer comprises:
a first layer contacting the plurality of dielectric layers;
a second layer encircled by the first layer, wherein the first layer has a first bottom lower than a second bottom of the second layer; and
a conductive feature encircled by the isolation layer, wherein the conductive feature is separated from the plurality of dielectric layers by the isolation layer.

13. The structure of claim 12, wherein a top end of the isolation layer is no higher than a top surface of a top dielectric layer of the plurality of dielectric layers.

14. The structure of claim 12, wherein the plurality of dielectric layers comprise:
a first dielectric layer, a second dielectric layer over the first dielectric layer, a third dielectric layer over the second dielectric layer, and a fourth dielectric layer over the third dielectric layer, wherein the isolation layer laterally extends into the first dielectric layer and the third dielectric layer, and the second dielectric layer and the fourth dielectric layer laterally extend into the isolation layer.

15. The structure of claim 12, wherein the second layer overlaps a bottom portion of the first layer.

16. The structure of claim 12, wherein a sidewall of the isolation layer contacting the plurality of dielectric layers is curved and has a wave pattern.

17. The structure of claim 12, wherein the second layer is separated from the metal pad by the first layer.

18. A structure comprising:

a conductive pad;

a conductive glue layer over and contacting the conductive pad;

a plurality of dielectric layers forming a multi-layer stack, the plurality of dielectric layers comprising:

first layers; and second layers, wherein the second layers are denser than the first layers, and wherein the first layers and the second layers are located alternatingly; and an isolation layer contacting sidewalls of, and encircled by, the plurality of dielectric layers, wherein the isolation layer forms a full ring, wherein first interfaces between the first layers and the isolation layer are laterally recessed more toward a corresponding closest edge of the conductive pad than second interfaces between the second layers and the isolation layer; and a conductive feature encircled by the isolation layer.

19. The structure of claim 18, wherein portions of the isolation layer contacting the plurality of dielectric layers comprise thicker portions and thinner portions, and wherein the thicker portions and the thinner portions are located alternatingly.

20. The structure of claim 18, wherein the isolation layer comprises:

a first layer contacting the plurality of dielectric layers; and a second layer encircled by the first layer, wherein the first layer has a first bottom lower than a second bottom of the second layer.

* * * * *